United States Patent
Ishikawa

(10) Patent No.: US 7,158,920 B2
(45) Date of Patent: Jan. 2, 2007

(54) NOISE CHECKING METHOD AND APPARATUS AND COMPUTER-READABLE RECORDING MEDIUM WHICH RECORDS A NOISE CHECKING PROGRAM

(75) Inventor: Yoichiro Ishikawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 174 days.

(21) Appl. No.: 10/979,117

(22) Filed: Nov. 3, 2004

(65) Prior Publication Data
US 2005/0283668 A1 Dec. 22, 2005

(30) Foreign Application Priority Data
Jun. 17, 2004 (JP) ............... 2004-180119

(51) Int. Cl.
*G06F 19/00* (2006.01)
(52) U.S. Cl. ............ 702/191; 702/69; 702/74; 702/75; 702/76; 702/79; 702/182
(58) Field of Classification Search ........... 702/691, 702/74, 75, 76, 79, 182, 191
See application file for complete search history.

(56) References Cited

U.S. PATENT DOCUMENTS

| | | | |
|---|---|---|---|
| 6,751,744 B1 * | 6/2004 | Allen et al. ............ 713/401 |
| 6,760,895 B1 * | 7/2004 | Ito et al. ............ 716/10 |
| 6,810,340 B1 * | 10/2004 | Shimazaki et al. ....... 702/65 |
| 6,915,249 B1 * | 7/2005 | Sato et al. ............ 703/14 |
| 7,031,889 B1 * | 4/2006 | McBride .............. 703/2 |
| 2002/0147553 A1 * | 10/2002 | Shimazaki et al. ....... 702/65 |
| 2003/0217344 A1 * | 11/2003 | Ito et al. ............ 716/6 |
| 2004/0041281 A1 * | 3/2004 | Sakai et al. ........... 257/784 |
| 2005/0283668 A1 * | 12/2005 | Ishikawa ............. 714/30 |

FOREIGN PATENT DOCUMENTS

| | | |
|---|---|---|
| JP | 8-278992 | 10/1996 |
| JP | 10-96762 | 4/1998 |
| JP | 2001-217315 | 8/2001 |
| JP | 2002-358341 | 12/2002 |

* cited by examiner

*Primary Examiner*—Carol S. W. Tsai
(74) *Attorney, Agent, or Firm*—Staas & Halsey LLP

(57) ABSTRACT

The apparatus reduces the amount of correction for noise value error, so as to reduce work needed for correction to ensure error avoidance, and to improve the freedom of layout design, and to reduce load on DA. Based on a timing chart of signal transfer on each wire, the last edge appearance timing in the signal waveform of a victim whose noise value exceeds a limit value is compared with the last edge appearance timing in the signal waveform of an aggressor, to evaluate the noise value error in the victim. The apparatus is used in static noise checking of cell arrangement and inter-cell wiring after such cell arrangement and inter-cell wiring are performed at design of integrated circuits such as LSIs.

24 Claims, 12 Drawing Sheets

FIG. 10

**** Static Noise 1:1 Check Error List **** (YY/MM/DD HH:MM:SS)

1:1 Check Ratio : 100 %  
Input ATW file : input_atw  
Input Slack file : input_slack

| NET Name | : net_dir1/signal1 | : SIGNAL | Lx1 = 2.0 | PAR |
|---|---|---|---|---|
| | ↑ VICTIM NET NAME | ↑ VICTIM NET TYPE | ↑ 1:1 LIMIT VALUE | |
| | : net_dir1/signal2 | : SIGNAL | Nv11 = 3.1 | 2000 |
| | ↑ AGGRESSOR NET NAME | ↑ AGGRESSOR NET TYPE | ↑ 1:1 NOISE VALUE | ↑ PARALLEL DIVISION LENGTH |

FIG. 11

**** Static Noise 1:2 Check Error List **** (YY/MM/DD HH:MM:SS)

1:2 Check Ratio : 100 %  
Input ATW file : input_atw  
Input Slack file : input_slack

| NET Name | : net_dir1/signal1 | : SIGNAL | Lx2 = 2.5 | PAR |
|---|---|---|---|---|
| | ↑ VICTIM NET NAME | ↑ VICTIM NET TYPE | ↑ 1:2 LIMIT VALUE | |
| | : net_dir1/signal2 | : SIGNAL | Nv12 = 3.5 | 500 |
| | : net_dir1/signal3 | : SIGNAL | | 1000 |
| | ↑ AGGRESSOR 1, 2 NET NAME | ↑ AGGRESSOR 1, 2 NET TYPE | ↑ 1:2 NOISE VALUE | ↑ PARALLEL DIVISION LENGTH |

NOISE CHECKING METHOD AND APPARATUS AND COMPUTER-READABLE RECORDING MEDIUM WHICH RECORDS A NOISE CHECKING PROGRAM

BACKGROUND OF THE INVENTION

1. Field of the Invention

The present invention relates to a static noise checking technique, which is performed during the design of an integrated circuit such as an LSI (Large Scale Integration). The static noise check is performed after cell arrangement and inter-cell wiring, to carry out noise checking on the cell arrangement/inter-cell wiring.

2. Description of the Related Art

Generally speaking, at design of integrated circuits such as LSIs, cell arrangement and inter-cell wiring are performed, and a noise value that may arise in each wire is calculated and checked. In cases where a noise value exceeding a limit value is caused, (that is, when a noise value error occurs), cell rearrangement and inter-cell rewiring are performed (for example, see Japanese Patent Application Publication Nos. HEI08-278992, HEI10-096762, 2001-217315, 2002-358341).

Referring to FIG. 12A, FIG. 12B, and FIG. 13, a common LSI designing method will be detailed hereinbelow. FIG. 12A and FIG. 12B are views for describing the hierarchical morphology of LSI design; FIG. 13 is a flowchart indicating common LSI designing procedures.

As shown in FIG. 12A and FIG. 12B, during LSI design, the LSI chip 1 is hierarchically organized into three groups: a chip level, a sub-chip level, and an LSG (Layout Sub Group) level. Cell arrangement and inter-cell wiring are performed on the lowest layer of the LSG level. Here, in FIG. 12A, reference character 1a designates a sub chip; reference character 1b, an LSG; reference character 1c, an external I/O area; reference character id, RAM macro in the LSG 1b; reference character 1e, a standard cell in the LSG 1b.

Such an LSI chip 1 is designed, following the procedures (steps S51 through S59) of FIG. 13. RTL (Register Transfer Level) designing is performed first (step S51), and logic synthesis (step S52) and floor planning cell arrangement (step S53) are then performed. Based on the floor planning, cell arrangement and inter-cell wiring are performed (step S54).

Based on the result of the cell arrangement and inter-cell wiring, static timing analysis is performed (step S55). If any problem (error such as signal delay/racing) in timing is present (YES route of step S56), the process returns to step S54, and cell arrangement and inter-cell wiring are performed once again. If there is no timing problem (NO route of step S56), static noise checking on the result of the cell arrangement and inter-cell wiring is performed (step S57).

In the static noise checking, a noise value is calculated as a degree at which at least one aggressor, which is a wire running in parallel with a victim wire that is to be checked, induces noise onto the victim, and it is evaluated whether or not the noise value exceeds a limit value (step S58). If the noise value exceeds the limit value, it is decided that a noise value error has occurred (YES route of step S58), the process returns to step S54, and the same procedures (steps S54 through S58) are repeated until step S58 makes a NO decision. On the other hand, if the noise value is equal to or smaller than the limit value, it is decided that no noise value error occurs (NO route of step S58), and manufacture data for the LSI chip 1 is produced based on the cell arrangement and the inter-cell wiring (step S59), and the designing of the LSI chip 1 is completed.

In the previous static noise check technique (step S57), a noise value is calculated on the assumption of the most critical (worst) condition, that is, on the assumption of a condition where the victim and the aggressor work concurrently, or a condition where signals are transferred on both of the wires concurrently. The calculated noise value and the limit value are compared, and all the victims in which the noise value exceeds the limit value are recognized as errors.

In actual LSIs, however, it is rare that all the logical cells connected to one wiring branch work concurrently, and some of the logical cells never work concurrently. That is, victims and their aggressors do not always work concurrently.

In spite of this, all the victims whose noise values exceed the limit value are recognized as errors, so that the number of errors is greatly increased, and a great amount of work is needed for correction to ensure error avoidance. In addition, the freedom of layout design is limited, load on DA (Design Automation) is increased, and optimum cell arrangement and inter-cell wiring in the whole of the LSI chip are unavailable.

In particular, due to a great amount of wiring thereof, recent LSIs contain wires running close to and in parallel with each other, even when spacing wiring is performed. Thus, if the foregoing static noise checking is performed, a great amount of noise value error is output.

In view of this disadvantage, a technique has been desired in which victims with no timing problem are excluded from the victims which are decided to have noise value errors. Correction is thus performed only on those wires experiencing actual timing problems, so that the amount of correction for noise value errors can be reduced.

SUMMARY OF THE INVENTION

With the foregoing problems in view, one object of the present invention is to make it possible to extract victims that have problems in terms of timing, from the victims which are evaluated to have noise value errors, so as to reduce the amount or correction for the noise value errors. This will not only reduce work needed for correction for the error avoidance, but also improve the freedom of layout design and reduce load on DA.

In order to accomplish the above object, according to the present invention, there is provided a noise checking method for performing, after carrying out cell arrangement and inter cell wiring in an integrated circuit, static noise checking on a result of the cell arrangement and the inter-cell wiring, the method comprising: a timing analyzing step, in which a timing chart of signal transfer on each wire is obtained by performing delay simulation with timing analysis based on the result of the cell arrangement and the inter-cell wiring; a noise value calculating step, in which a noise value is calculated, the noise value representing a degree at which at least one affecting wire (hereinafter will be called the "aggressor"), running in parallel with an object wire (hereinafter will be called the "victim") to be checked, induces noise onto the victim; a noise value evaluating step, in which it is evaluated whether or not the noise value calculated at the noise value calculating step exceeds a limit value; and an error evaluating step, in which, if it is evaluated at the noise value evaluating step that the noise value is greater than the limit value, comparison is performed, based on the timing chart obtained at the timing analyzing step, between a last edge appearance timing in a signal waveform transmitted on the victim and a last edge appearance timing in a signal waveform transmitted on the aggressor, and then a decision is made on a noise value error in the victim based on the comparison result.

As a generic feature, there is provided a noise checking method for performing, after carrying out cell arrangement and inter cell wiring in an integrated circuit, static noise checking on a result of the cell arrangement and the inter-cell wiring, the method comprising: a timing analyzing step, in which a timing chart of signal transfer on each wire is obtained by performing delay simulation with timing analysis based on the result of the cell arrangement and the inter-cell wiring; a one-to-one noise value calculating step, in which a one-to-one noise value is calculated, the one-to-one noise value representing a degree at which one affecting wire (hereinafter will be called the "aggressor"), running in parallel with an object wire (hereinafter will be called the "victim") to be checked, induces noise onto the victim; a one-to-one noise value evaluating step, in which it is evaluated whether or not the one-to-one noise value, calculated at the one-to-one noise value calculating step, exceeds a first limit value; a one-to-n noise value calculating step, in which, if it is evaluated at the one-to-one noise value evaluating step that the one-to-one noise value does not exceed the first limit value, a one-to-n noise value is calculated, the one-to-n noise value representing a degree at which n (n is a natural number equal to or greater than 2) aggressors, running in parallel with the victim, induces noise onto the victim; a one-to-n noise value evaluating step, in which it is evaluated whether or not the one-to-n noise value, calculated at the one-to-n noise value calculating step, exceeds a second limit value; and a first error evaluating step, in which, if it is evaluated at the one-to-n noise value evaluating step that the one-to-n noise value exceeds the second limit value, comparison is performed, based on the timing chart obtained at the timing analyzing step, between a last edge appearance timing in a signal waveform transmitted on the victim and last edge appearance timings in signal waveforms transmitted on the n aggressors, and then a decision is made on a noise value error in the victim based on the comparison result.

As one preferred feature, the noise checking method further comprises: a permissible upper limit value evaluating step, in which, if it is evaluated at the one-to-one noise value evaluating step that the one-to-one noise value exceeds the first limit value, it is then evaluated whether or not the one-to-one noise value of the victim exceeds a permissible upper limit value which is obtained by adding a specific permissible value to the first limit value; and a second error evaluating step, in which, if it is evaluated at the permissible upper limit evaluating step that the one-to-one noise value does not exceed the permissible upper limit, comparison is performed, based on the timing chart obtained at the timing analyzing step, between a last edge appearance timing in a signal waveform transmitted on the victim and a last edge appearance timing in a signal waveform transmitted on the one aggressor, and then a decision is made on a noise value error in the victim based on the comparison result. If it is evaluated at the second error evaluating step that no noise value error occurs in the victim, the method proceeding to the one-to-n noise value calculating step, the one-to-n noise value evaluating step, and the first error evaluating step.

As another preferred feature, at the first error evaluating step, when the comparison is performed between the last edge appearance timing in the signal waveform transmitted on the victim and last edge appearance timings in the signal waveforms transmitted on the n aggressors, the signal waveforms of the n aggressors are synthesized, and comparison is made between a last edge appearance timing of the synthesized signal waveform and the last edge appearance timing of the waveform transmitted on the victim.

As still another preferred feature, at the error evaluating step, if the last edge appearance timing in the signal waveform transmitted on the aggressor is later than the last edge appearance timing in the signal waveform transmitted on the victim, it is evaluated that a noise error occurs in the victim.

As a further preferred feature, at the timing analyzing step, a slack value, which is a timing margin of a driver of the victim, is calculated by the delay simulation. At the error evaluating step, if the last edge appearance timing in the signal waveform transmitted on the aggressor is later than a timing which is obtained by adding the slack value to the last edge appearance timing of the signal waveform transmitted on the victim, it is evaluated that a noise value error occurs in the victim.

As a generic feature, there is provided a noise checking apparatus for performing, after carrying out cell arrangement and inter cell wiring in an integrated circuit, static noise checking on a result of the cell arrangement and the inter-cell wiring, the apparatus comprising: a timing analyzing unit, in which a timing chart of signal transfer on each wire is obtained by performing delay simulation with timing analysis based on the result of the cell arrangement and the inter-cell wiring; a noise value calculating unit, in which a noise value is calculated, the noise value representing a degree at which at least one affecting wire (hereinafter will be called the "aggressor"), running in parallel with an object wire (hereinafter will be called the "victim") to be checked, induces noise onto the victim; a noise value evaluating unit, in which it is evaluated whether or not the noise value calculated by the noise value calculating unit exceeds a limit value; and an error evaluating unit, in which, if it is evaluated by the noise value evaluating unit that the noise value is greater than the limit value, comparison is performed, based on the timing chart obtained by the timing analyzing unit, between a last edge appearance timing in a signal waveform transmitted on the victim and a last edge appearance timing in a signal waveform transmitted on the aggressor, and then a decision is made on a noise value error in the victim based on the comparison result.

As another generic feature, there is provided a noise checking apparatus for performing, after carrying out cell arrangement and inter cell wiring in an integrated circuit, static noise checking on a result of the cell arrangement and the inter-cell wiring, the apparatus comprising: a timing analyzing unit, in which a timing chart of signal transfer on each wire is obtained by performing delay simulation with timing analysis based on the result of the cell arrangement and the inter-cell wiring; a one-to-one noise value calculating unit, in which a one-to-one noise value is calculated, the one-to-one noise value representing a degree at which one affecting wire (hereinafter will be called the "aggressor"), running in parallel with an object wire (hereinafter will be called the "victim") to be checked, induces noise onto the victim; a one-to-one noise value evaluating unit, in which it is evaluated whether or not the one-to-one noise value, calculated by the one-to-one noise value calculating unit, exceeds a first limit value; a one-to-n noise value calculating unit, in which, if it is evaluated by the one-to-one noise value evaluating unit that the one-to-one noise value does not exceed the first limit value, a one-to-n noise value is calculated, the one-to-n noise value representing a degree at which n (n is a natural number equal to or greater than 2)

aggressors, running in parallel with the victim, induces noise onto the victim; a one-to-n noise value evaluating unit, in which it is evaluated whether or not the one-to-n noise value, calculated by the one-to-n noise value calculating unit, exceeds a second limit value; and a first error evaluating unit, in which, if it is evaluated by the one-to-n noise value evaluating unit that the one-to-n noise value exceeds the second limit value, comparison is performed, based on the timing chart obtained by the timing analyzing unit, between a last edge appearance timing in a signal waveform transmitted on the victim and last edge appearance timings in signal waveforms transmitted on the n aggressors, and then a decision is made on a noise value error in the victim based on the comparison result.

As still another generic feature, there is provided a computer-readable recording medium in which is recorded a noise checking program for a computer to function as a noise checking apparatus for performing, after carrying out cell arrangement and inter cell wiring in an integrated circuit, static noise checking on a result of the cell arrangement and the inter-cell wiring, the program instructing the computer to function as the following: a timing analyzing unit, in which a timing chart of signal transfer on each wire is obtained by performing delay simulation with timing analysis based on the result of the cell arrangement and the inter-cell wiring; a noise value calculating unit, in which a noise value is calculated, the noise value representing a degree at which at least one affecting wire (hereinafter will be called the "aggressor"), running in parallel with an object wire (hereinafter will be called the "victim") to be checked, induces noise onto the victim; a noise value evaluating unit, in which it is evaluated whether or not the noise value calculated by the noise value calculating unit exceeds a limit value; and an error evaluating unit, in which, if it is evaluated at the noise value evaluating step that the noise value is greater than the limit value, comparison is performed, based on the timing chart obtained by the timing analyzing unit between a last edge appearance timing in a signal waveform transmitted on the victim and a last edge appearance timing in a signal waveform transmitted on the aggressor, and then a decision is made on a noise value error in the victim based on the comparison result.

The noise check of the present invention is performed based on the following fact. When a noise value of a victim exceeds a limit value, and also when the last signal change on an aggressor appears earlier (at the same time or earlier) than the last signal change on the victim, it is highly possible that a noise is caused in the victim, so that a signal becomes unstable. On the other hand, even when a noise value exceeds a limit value in a victim, the signal never becomes unstable if the last signal change on an aggressor appears later than the last signal change on the victim. Hence, the last edge appearance timing in the signal waveform of the victim whose noise value exceeds a limit value is compared with the last edge appearance timing in the signal waveform of the aggressor, based on a timing chart [for example, data for an ATW (Arrival Timing Window)] of signal transfer on each wire. Based on the comparison result, it is evaluated whether or not the noise value error of the victim has a problem in terms of the timing, and only wires with timing problems are extracted.

Only the thus extracted wires are subjected to correction, so that the amount of correction for the noise value error is reduced. This will not only reduce work needed for correction for the error avoidance, but also improve the freedom of layout design and reduce load on DA. In addition, optimum cell arrangement and inter-cell wiring are realized.

Other objects and further features of the present invention will be apparent from the following detailed description when read in conjunction with the accompanying drawings.

BRIEF DESCRIPTION OF THE DRAWINGS

FIG. 10 is an example of an error list obtained by noise check (one-to-one noise check) of the present embodiments;

FIG. 11 is an example of an error list obtained by noise check (one-to-two noise check) of the present embodiments;

DESCRIPTION OF THE PREFERRED EMBODIMENT(S)

Embodiments of the present invention will now be described with reference to the relevant accompanying drawings.

[1] First Embodiment

Figure 1:
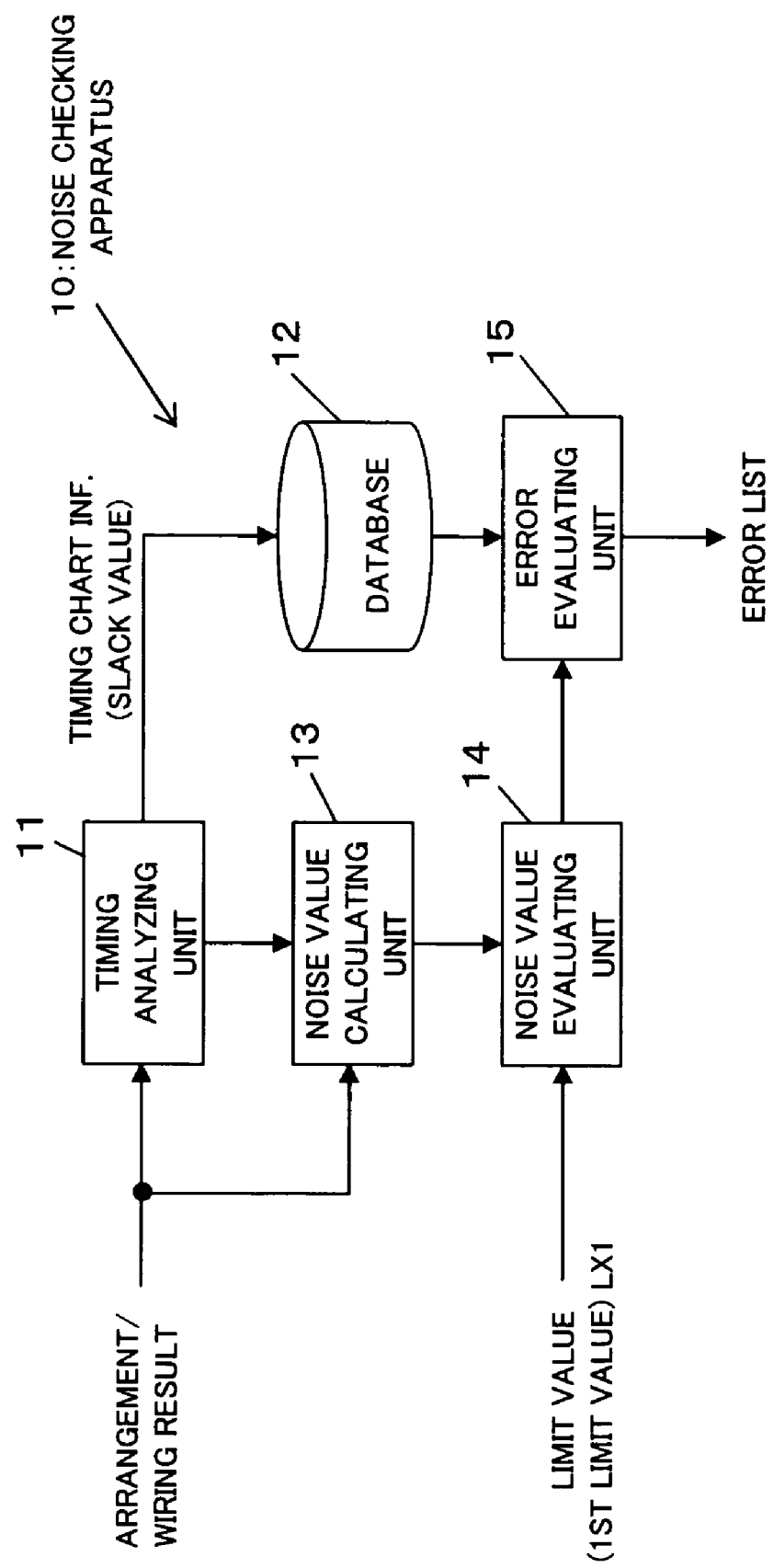
FIG. 1 is a block diagram showing a functional construction of a noise checking apparatus according to a first embodiment of the present invention.

FIG. 1 is a block diagram showing a functional construction of a noise checking apparatus according to a first embodiment of the present invention. As shown in FIG. 1, a noise checking apparatus 10 of the first embodiment includes a timing analyzing unit 11, a database 12, a noise value calculating unit 13, a noise value evaluating unit 14, and an error evaluating unit 15. These elements are provided in an attempt to realize static noise checking on a result of cell arrangement and inter-cell wiring in integrated circuits such as LSIs, after the cell arrangement and the inter-cell wiring is carried out.

The timing analyzing unit 11 carries out delay simulation by use of timing analysis, based on the result of cell arrangement and the inter-cell wiring, to obtain a timing chart of signal transfer on each wire, and the timing analyzing unit 11 also calculates a slack value, which is a timing margin of the driver of each wire, and stores the thus obtained timing chart and the slack value in the database 12.

Here, the foregoing timing chart is shown in an Arrival Timing Window (ATW) on the display, as a result of delay simulation by the timing analyzing unit 11, and the timing chart information, originally obtained so as to be shown in the ATW, is utilized in evaluation performed by the error evaluating unit 15.

Further, the slack value is a timing margin that is obtained from the delay simulation result, and it is calculated from path arrival time with respect to cycle time. The slack value is provided for the driver terminal on each path (wire). In the present embodiment, as will be detailed later with reference to FIG. 5, the slack value is used as the value of the driver terminal of an object wire net to be checked (hereinafter will be called the "victim").

The noise value calculating unit 13 calculates a degree at which one affecting wire (hereinafter will be called the "aggressor"), running parallel with the victim, induces noise onto the victim, as a 1-to-1 noise value Nv11. This 1-to-1 noise value Nv11 is obtained by, for example, the following formula (1):

$$Nv11 = \Sigma\{Ln \times Ka \times f(C,L)\} \qquad (1)$$

where Nv11 is a 1-to-1 noise value (1:1 noise value; victim: aggressor); Ln is the length (parallel division length/parallel length; see, for example, FIG. 3) of a division of a specific net (aggressor net), which division runs in parallel with the victim net (object wire to be checked); Ka is a check coefficient of the victim net and the aggressor net; f (C, L) is a relaxation function having the distance L and the capacity C as parameters.

The noise value evaluating unit 14 evaluates whether or not the 1-to-1 noise value Nv11, which is calculated by the noise value calculating unit 13, exceeds the limit value (called the "first limit value" in the second embodiment) Lx1 of the 1-to-1 noise. The limit value Lx1 depends on the combination of a victim net and an aggressor net. If the 1-to-1 noise value Nv11 is equal to or smaller than the limit value Lx1 (Nv11≦Lx1), the noise value evaluating unit 14 decides that no noise value error occurs in the victim. On the otherhand, if the 1-to-1 noise value Nv11 exceeds the limit value Lx1 (Nv11>Lx1), the noise value evaluating unit 14 recognizes the victim as an error wire candidate in which a noise value error occurs.

In previous noise checking methods, if the noise value evaluating unit 14's evaluation is Nv11>Lx1, it is decided that noise value errors occur in all the victims, and each of the victims is subjected to the correction of cell arrangement/inter-cell wiring. However, in the present embodiment, victims in which Nv11>Lx1 are firstly recognized as candidate wires in which errors occur, and the error evaluating unit 15 divides them into two groups, one with timing problems, the other without timing problems.

The error evaluating unit 15 reads out timing chart information (data for ATW), obtained by the timing analyzing unit 11, from the database 12, and based on the timing chart, the error evaluating unit 15 compares the timing at which the last edge appears in the signal waveform of the victim with the timing at which the last edge appears in the signal waveform of the aggressor. On the basis of the comparison result, the error evaluating unit 15 evaluates noise value errors in the individual candidate wires (error wire candidates).

More specifically, as a result of the comparison of the last edge appearance timing, if it is found that the last edge of the signal waveform of the aggressor appears later than the last edge of the signal waveform of a victim (error wire candidate), the error evaluating unit 15 decides that an error is present in the victim, and stores information (error net data) about the victim, as an error list, in a database or the like.

Here, in cases where the last signal change in the aggressor appears later than the last signal change in the victim, it is highly possible that the signal of the victim is unstable due to noise caused in the victim as a result of the effect of the signal change. However, it is proved that, even if the noise value of the victim exceeds a limit value, the signal of the victim does not become unstable at timing other than the foregoing timing.

Thus, in view of such timing of signal change, the following are performed. If the error evaluating unit 15 evaluates that the last edge in the signal waveform of the aggressor appears earlier than the last edge of the waveform of the victim, the victim is decided to exhibit no timing problem even if the noise value Nv11 exceeds the limit value Lx1, and the victim is excluded from the error wire candidates. On the other hand, if the error evaluating unit 15 evaluates that the last edge in the signal waveform of the aggressor appears later than the last edge of the waveform of the victim, it is decided that the victim (error wire candidate) exhibits a timing problem and is then listed in an error list.

Figure 2:
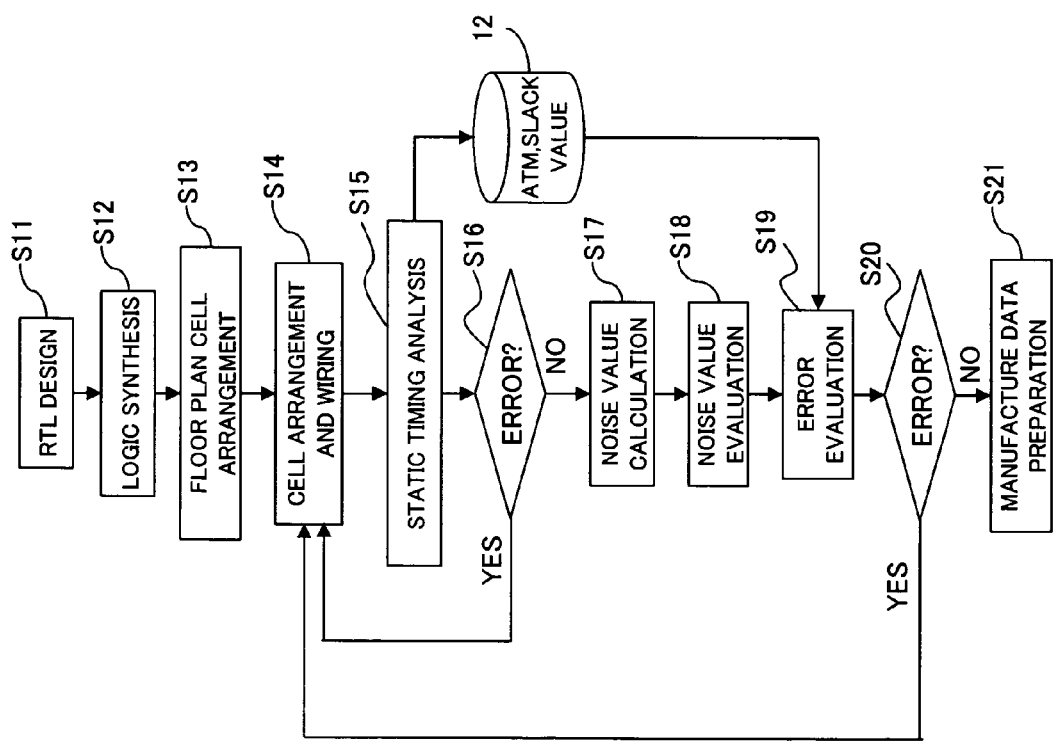
FIG. 2 is a flow chart indicating a process (noise checking process) of LSI design in which the noise checking apparatus of the first embodiment is applied.
Figure 3:
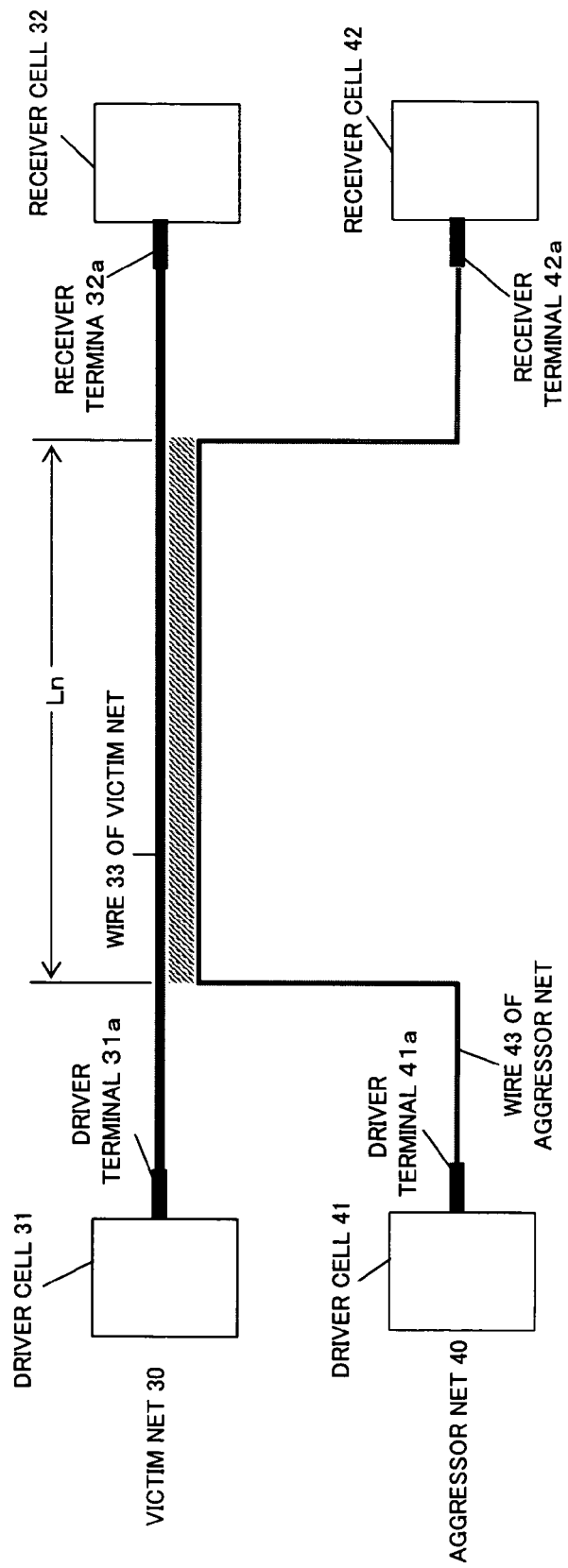
FIG. 3 is a concrete net path model for use in describing calculation/evaluation of a one-to-one noise value of the first embodiment.
Figure 4:
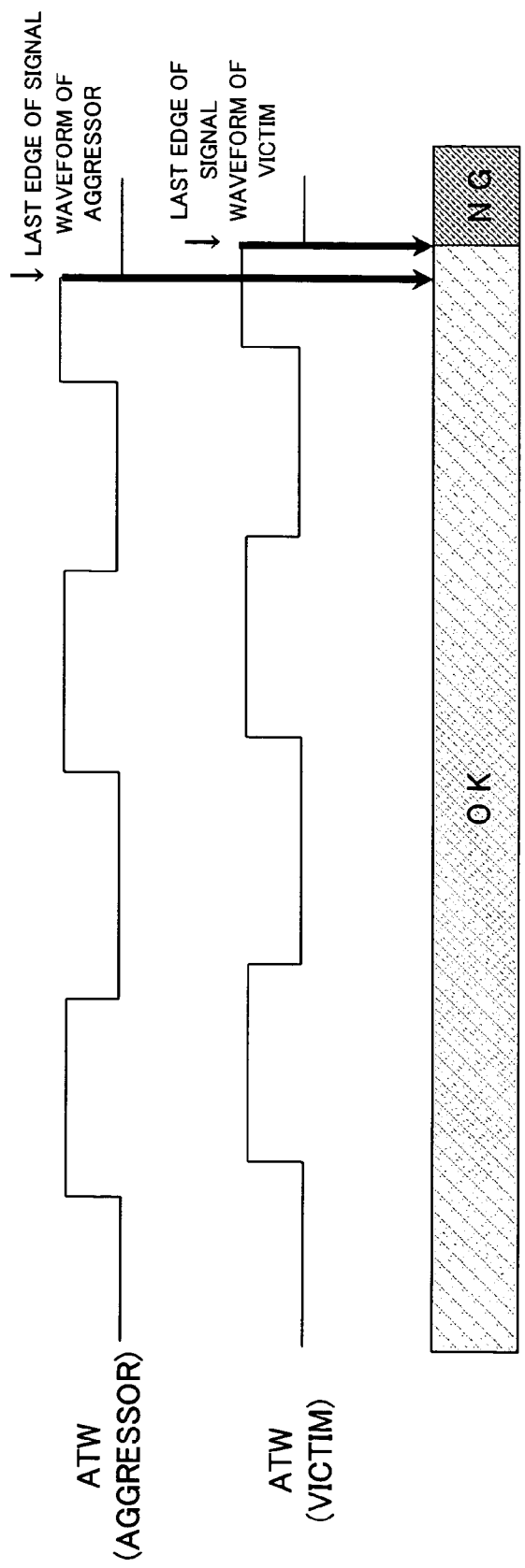
FIG. 4 is a timing chart for use in detailing error evaluation (evaluation of timing with which the last edge of the signal waveform appears) of the first embodiment.

Next, a description will be made hereinbelow of an operation of the noise checking apparatus 10 of the first embodiment, referring to FIG. 2 through FIG. 4 and FIG. 10. FIG. 2 is a flow chart indicating a process (noise checking process) of LSI design in which the noise checking apparatus of the first embodiment is applied; FIG. 3 is a concrete net path model for use in describing calculation/evaluation of a one-to-one noise value of the first embodiment; FIG. 4 is a timing chart for use in detailing error evaluation (evaluation of timing with which the last edge of the signal waveform appears) of the first embodiment; FIG. 10 is an example of an error list obtained by noise check (one-to-one noise check) of the present embodiments.

In the beginning, referring to the flow chart (steps S11 through S21) of FIG. 2, an LSI designing process (including a noise checking process) to which the noise checking apparatus 10 of the first embodiment is applied is described.

Figure 13:
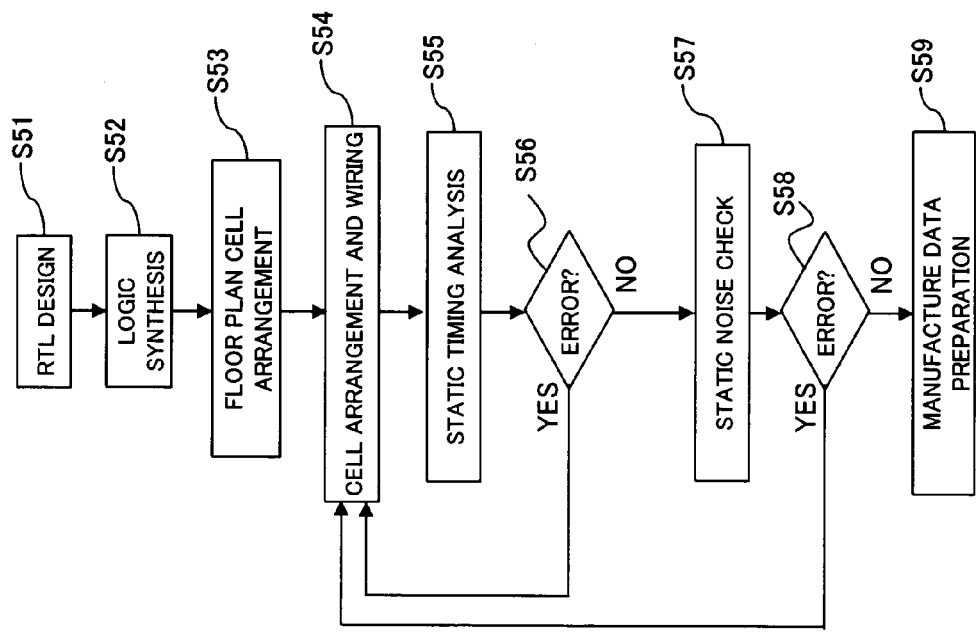
FIG. 13 is a flow chart indicating common LSI designing procedures.

In the first embodiment, similar to steps S51 through S54 in FIG. 13, RTL design is performed (step S11), and logic synthesis (step S12) and floor planning cell arrangement (step S13) are performed, before cell arrangement and inter-cell wiring processes are actually performed according to the floor plan (step S14).

After that, in the timing analyzing unit 11, delay simulation with static timing analysis is performed based on a result of the cell arrangement and the inter-cell wiring, to obtain a timing chart (data for ATW) of signal transfer over the individual wires. At the same time, the slack values of the drivers of the individual wires are calculated, and the timing chart and the slack values are stored in the database 12 (step S15; the timing analysis step).

As a result of the static timing analysis, if a timing problem (delay in signals/errors such as racing) is present (YES route of step S16), the process returns to step S14, and cell arrangement and inter-cell wiring are performed once again. On the other hand, if no timing error is present (NO route of step S16), static noise checking (steps S17 and S18) is performed on the cell arrangement and the inter-cell wiring, and an error evaluation is performed on the result of the noise check (step S19). That is, in the first embodiment, the following steps S17 through S19 are performed for each wire (wire net); the individual wire is treated as a victim.

First of all, the noise value calculating unit 13 calculates a 1-to-1 noise value Nv11 of the victim by using the foregoing formula (1) (step S17; noise value calculating step). The noise value evaluating unit 14 evaluates whether or not the thus obtained 1-to-1 noise value Nv11 exceeds a 1-to-1 noise limit value Lx1 (step S18; noise value evaluating step).

Here, as shown in FIG. 3, a wire which has a portion thereof that runs close to and in parallel with the victim 33 a distance Ln, serves as an aggressor 43, and the degree at which the aggressor 43 induces noise in the signal of the victim 33 is calculated as the 1-to-1 noise value Nv11 and is compared with the limit value Lx1. In this model in FIG. 3, the victim 33 is included in a victim net 30, and connects between a driver terminal 31a of a driver cell 31 and a receiver terminal 32a of a receiver cell 32. The aggressor 43 is included in an aggressor net 40, and connects between a driver terminal 41a of a driver cell 41 and a receiver terminal 42a of a receiver cell 42.

If the 1-to-1 noise value Nv11 is equal to or samller than the limit value Lx1 (Nv11≦Lx1), it is evaluated that the no noise value error occurs in the victim. Whereas, if the 1-to-1 noise value Nv11 exceeds the limit value Lx1 (Nv11>Lx1), the victim is recognized as an error wire candidate, in which it is highly possible that a noise value error occurs.

Here, as a result of evaluation at step S18, if there is no error wire candidate at all, step S20 makes a decision of no noise value error (NO route), without the error evaluating step (step S19; will be detailed later) being carried out (that is, the error evaluating unit 15 does not output an error list), and manufacture data of the LSI chip 1 is produced based on the result of the cell arrangement and the inter-cell wiring (step S21), and the design of the LSI chip 1 is completed.

Generally speaking, however, in designing of LSIs on which large amounts of wiring are mounted, it is rare that there is no error wire candidate in the first cell arrangement/inter-cell wiring. Thus, more than one error wire candidate is usually obtained at step S18.

When the error wire candidates are obtained, the timing chart information (data for ATW), obtained by the timing analyzing unit 11, is read out from the database 12. On the basis of the timing chart information, the error evaluating unit 15 compares the timing at which the last edge appears in the signal waveform of each victim (error wire candidate), in which the noise value evaluating unit 14 decides Nv11>Lx1, with the timing at which the last edge appears in the signal waveform of the aggressor. According to the comparison result, noise value error evaluation of the victim is performed (step S19; error evaluating step).

More specifically, the error evaluating unit 15 obtains the waveforms of the aggressor and the victim in form of a timing chart (data for ATW) of FIG. 4. Referring to the waveforms, comparison/evaluation are made to find if the last edge of the signal waveform of the aggressor appears later than the last edge of the signal waveform of the victim (NG region of FIG. 4) or if the former appears earlier than the latter (OK region of FIG. 4).

As a result of the comparison, if the last edge of the waveform of the aggressor appears later than the last edge of the waveform of the victim (error wire candidate) (NG region of FIG. 4), the error evaluating unit 15 evaluates that a noise value error occurs in the victim, and error net data is output as an error list (1-to-1 noise value check result) of FIG. 10, and stored in a database or the like. On the other hand, if the last edge of the signal waveform of the aggressor appears earlier than the last edge of the waveform of the victim (error wire candidate) (OK region of FIG. 4), it is evaluated that there is no problem with the victim in terms of timing even though the noise value Nv11 exceeds the limit value Lx1, and the victim is excluded from the error wire candidates.

Here, the 1-to-1 noise value is obtained for every pair of wires running close to and in parallel with each other (step S17). The aforementioned noise value evaluation (step S18) and the error evaluation (step S19) are then performed on the individual 1-to-1 noise values.

The error list of FIG. 10 contains not only 1-to-1 check rate (100%), ATW file name (input_atw), a slack file name (input_slack), but also information about the victim [victim net name (net_dir1/signal1), victim net type (SIGNAL), 1-to-1 limit value (Lx1=2.0)] and information about the aggressor [aggressor net name (net_dir1/signal2), aggressor net type (SIGNAL), and 1-to-1 noise value (Nv11=3.0), parallel division length (parallel length) Ln (2000)].

If any error wire candidates are listed in the error list, a decision is made that a noise value error occurs (YES route of step S20), and the process returns to step S14, and the foregoing procedures (step S14 through step S20) are repeated until a NO decision (that is, there is no error wire candidate in the error list) is made at step S20. If there is no error wire candidate in the error list any more (NO route of step S20), manufacture data of the LSI chip is produced based on the result of the cell arrangement and the inter-cell wiring (step S21), and the designing of the LSI chip is completed.

In the noise checking apparatus 10, based on the timing chart information of the signal transfer, which is data obtained for ATW, the last edge appearance timing in the waveform of the victim (error wire candidate) is compared with the last edge appearance timing in the waveform of the aggressor. On the basis of the comparison result, it is evaluated whether or not the noise value error of the error wire candidate has a problem in terms of timing, and only wires with such timing problems are extracted.

Since only the thus extracted wires are subjected to correction (cell rearrangement/inter-cell rewiring) the amount of correction for noise value errors is reduced. As a result, work needed for error avoidance is greatly reduced, and layout design can be performed more freely with less load caused on DA (Design Automation). Moreover, the cell arrangement and inter-cell wiring are optimized.

Figure 5:
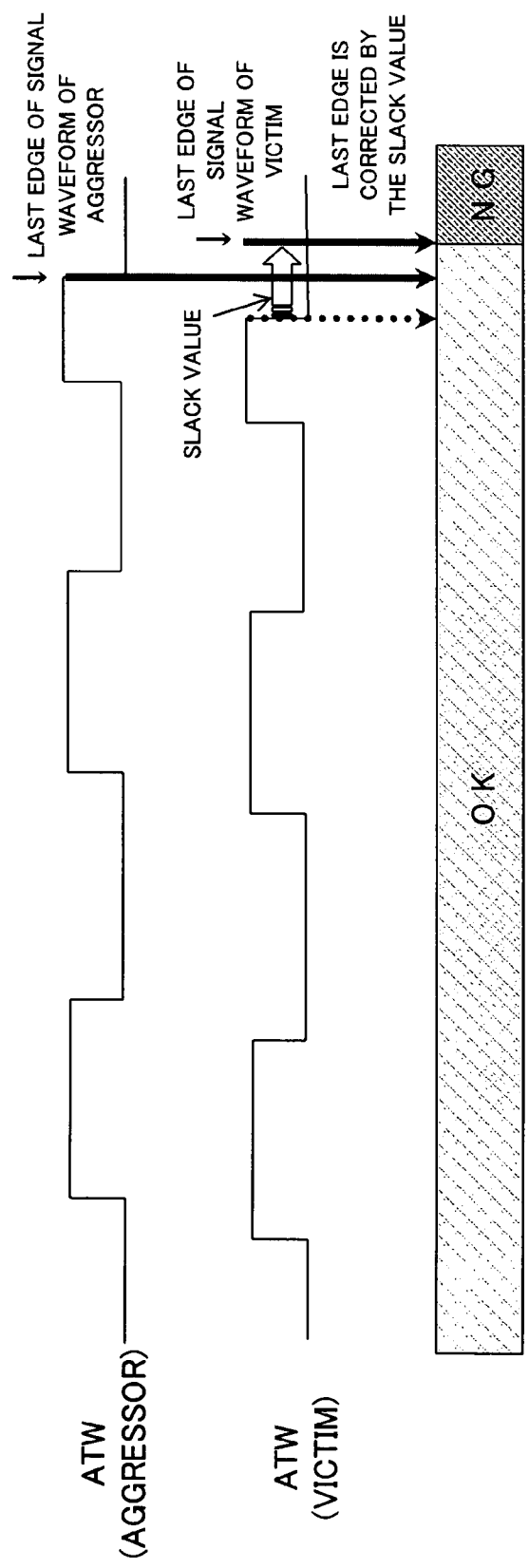
FIG. 5 is a timing chart for use in detailing a modified example of error evaluation (evaluation of timing with which the last edge of the signal waveform appears) of the first embodiment.

In the first embodiment, the error evaluating unit 15 performs comparison between the last edge appearance timing in the signal waveform of the victim and the last edge appearance timing in the signal waveform of the aggressor. At that time, slack values of the drivers of the individual wires, obtained by the timing analyzing unit 11, are read out from the database 12, the slack values may be taken into consideration at the last edge appearance timing comparison/evaluation. FIG. 5 is a timing chart for use in detailing a modified example of error evaluation (evaluation of timing with which the last edge of the signal waveform appears) of the first embodiment. As shown in FIG. 5, it is evaluated whether the timing at which the last edge of the signal waveform of the aggressor appears is later (NG region of FIG. 5) or earlier (OK region of FIG. 5) than the timing at which the last edge of the signal waveform of the victim appears, taking the slack value into consideration. If the timing of the last edge appearance in the aggressor waveform is present in the NG region of FIG. 5, the error evaluating unit 15 decides that a noise value error occurs in the subject. In consequence, the reference value for checking noise value errors is relaxed in comparison with the foregoing reference value of the first embodiment, so that the amount of correction for the noise value error is further reduced.

[2] Second Embodiment

Figure 6:
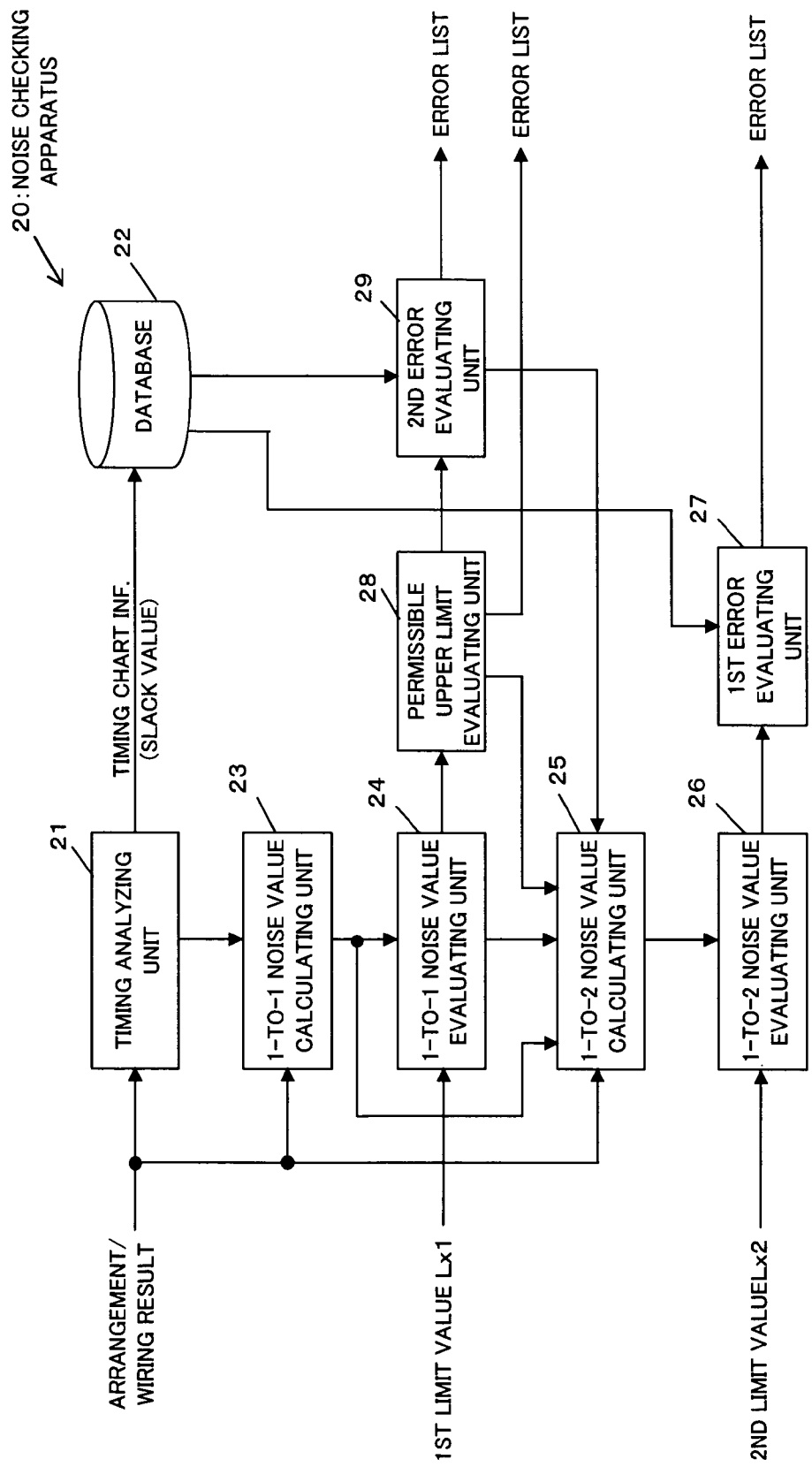
FIG. 6 is a block diagram showing a function construction of a noise checking apparatus according to a second embodiment of the present invention.

FIG. 6 is a block diagram showing a functional construction of a noise checking apparatus according to a second embodiment of the present invention. A noise checking apparatus 20 of the second embodiment includes a timing analyzing unit 21, a database 22, a 1-to-1 noise value calculating unit 23, a 1-to-1 noise value evaluating unit 24, a 1-to-2 noise value calculating unit 25, a 1-to-2 noise value evaluating unit 26, a first error evaluating unit 27, a permissible upper limit value evaluating unit 28, and a second error evaluating unit 29. These elements are provided in an attempt to realize static noise checking on a result of cell arrangement and inter-cell wiring in integrated circuits, after the cell arrangement and the inter-cell wiring is carried out.

Here, the timing analyzing unit 21, database 22, 1-to-1 noise value calculating unit 23, and 1-to-1 noise value evaluating unit 24, are similar to the timing analyzing unit 11, database 12, noise value calculating unit 13, and noise value evaluating unit 14, respectively, of the first embodiment, and detailed description is thus omitted here.

The 1-to-2 noise value calculating unit (one-to-n noise value calculating unit) 25 calculates a 1-to-2 noise value Nv12 as a degree at which two aggressors (aggressor 1 and aggressor 2), running close to and in parallel with a victim (in which the 1-to-1 noise value evaluating unit 24 decides that the 1-to-1 noise value Nv11 is equal to or smaller than the first limit value Lx1), induce noise onto the victim. This 1-to-2 noise value Nv12 is obtained by, for example, the following formula (2):

$$Nv12=(Nv11a+Nv11b) \times Kc \qquad (2)$$

where $Nv11a$ is a 1-to-1 noise value (1:1 noise value; victim:aggressor 1), obtained by the 1-to-1 noise value calculating unit 23 with the foregoing formula (1), between the victim and one (aggressor 1) of the aggressors; $Nv11b$ is a 1-to-1 noise value (1:1 noise value; victim:aggressor 2), obtained by the 1-to-1 noise value calculating unit 23 with the foregoing formula (1), between the victim and the other one (aggressor 2) of the aggressors; Kc is a check coefficient of the victim net and the aggressor net.

The 1-to-2 noise value calculating unit 25 also calculates a 1-to-2 noise value Nv12 with the above formula (2) for a victim in which the permissible upper limit value evaluating unit 28 decides that the 1-to-1 noise value Nv11 does not exceed the permissible upper limit value (Lx1+B).

The 1-to-2 noise value evaluating unit (1-to-n noise value evaluating unit) 26 evaluates whether or not the 1-to-2 noise value Nv12, obtained by the 1-to-2 noise value calculating unit 25, exceeds the second limit value Lx2. The second limit value Lx2 depends on the combination of a victim net and an aggressor net. If the 1-to-2 noise value Nv12 is equal to or smaller than the limit value Lx2 (Nv12<Lx2), the 1-to-2 noise value evaluating unit 26 decides that no noise value error occurs in the victim. On the other hand, if the 1-to-2 noise value Nv12 exceeds the limit value Lx2 (Nv12>Lx2), the 1-to-2 noise value evaluating unit 26 recognizes the victim as an error wire candidate in which the occurrence of a noise value error is highly possible.

The first error evaluating unit 27 carries out approximately the same functions as those of the error evaluating unit 15 of the first embodiment. The first error evaluating unit 27 reads out timing chart information (data for ATW), obtained by the timing analyzing unit 21, from the database 22. On the basis of the timing chart, the first error evaluating unit 27 compares the timing at which the last edge appears in the signal waveform of a victim (error wire candidate) in which the 1-to-2 noise value evaluating unit 26 decides that Nv12>Lx2, with the timings at which the last edge appears in the signal waveforms of the two aggressors (aggressor 1 and aggressor 2). On the basis of the comparison result, the first error evaluating unit 27 evaluates a noise value error in each victim (error wire candidates).

When comparing the last edge appearance timing in the signal waveform of the victim with the last edge appearance timings in the signal waveforms of the two aggressors (aggressor 1 and aggressor 2), the first error evaluating unit 27 synthesizes the two signal waveforms, as will be detailed later with reference to FIG. 9, and compares the last edge appearance timing in the synthesized signal waveform (logical OR of the two signal waveforms) with the last edge appearance timing in the signal waveform of the victim.

As a result of the comparison, if it is found that the last edge of the synthesized signal waveform appears later than the last edge of the signal waveform of a victim, the first error evaluating unit 27 decides that an error is present in the victim (error wire candidate), and outputs information (error net data) about the victim as an error list, and stores the information in a database or the like. If the first error evaluating unit 27 decides that the last edge in the synthesized waveform appears earlier than the last edge in the signal waveform of the victim, it is decided that the victim has no problem in terms of timing even if the 1-to-1 noise value Nv12 exceeds the limit value Lx2, and the victim is excluded from the error wire candidates.

The permissible upper limit value evaluating unit 28 evaluates victims in which the 1-to-1 noise value evaluating unit 24 decides that the 1-to-1 noise value Nv11 exceeds the first limit value Lx1, in terms of whether or not the 1-to-1 noise value Nv11 exceeds a permissible upper limit value Lx1+B, which is obtained by adding a specific permissible value B to the first limit value Lx1. The specific permissible value B is a margin of 1-to-1 noise, and the value B depends on the combination of a victim net and a aggressor net, as in the case of upper limits Lx1 and Lx2. The evaluation performed by the permissible upper limit value evaluating unit 28 narrows down the objects of evaluation performed by the second error evaluating unit 29 to victims (error wire candidates) having 1-to-1 noise value Nv11 within a permissible range (a permissible upper limit value Lx1+B or smaller).

If the permissible upper limit value evaluating unit 28 decides that the 1-to-1 noise value Nv11 exceeds the permissible upper limit value Lx1+B, it makes a decision that the 1-to-1 noise value Nv11 is sufficiently large so that a noise error will be reliably caused in the victim. The permissible upper limit value evaluating unit 28 then outputs information (error net data) about the victim as an error list and stores the information in a database or the like.

The second error evaluating unit 29 carries out functions approximately the same as those of the error evaluating unit 15 of the first embodiment. The second error evaluating unit 29 reads out timing chart information (data for ATW), obtained by the timing analyzing unit 21, from the database 22. On the basis of the timing chart, the second error evaluating unit 29 compares the timing at which the last edge appears in the signal waveform of a victim in which the permissible upper limit value evaluating unit 28 decides that the 1-to-1 noise value is equal to or smaller than the permissible upper limit value Lx1+B, with the timings at which the last edge appears in the signal waveform of the aggressor. According to the comparison result, the second error evaluating unit 29 evaluates a noise value error in the victim.

As a result of the comparison, if the last edge in the waveform of the aggressor appears later than the last edge in the waveform of the victim, the second error evaluating unit 29 decides that a noise value error occurs in the victim (error wire candidate), and outputs information (error net data) about the victim as an error list and stores the information in a database or the like. On the other hand, if the second error evaluating unit 29 decides that the last edge in the waveform of the aggressor appears earlier than the last edge in the waveform of the victim, it is evaluated that there is no problem with the victim in terms of timing even though the 1-to-1 noise value exceeds the limit value $Lx1$, and the victim is excluded from the error wire candidates. The victim is then subjected to the processing performed by the 1-to-2 noise value calculating unit 25, the 1-to-2 noise value evaluating unit 26, and the first error evaluating unit 27.

Figure 7:
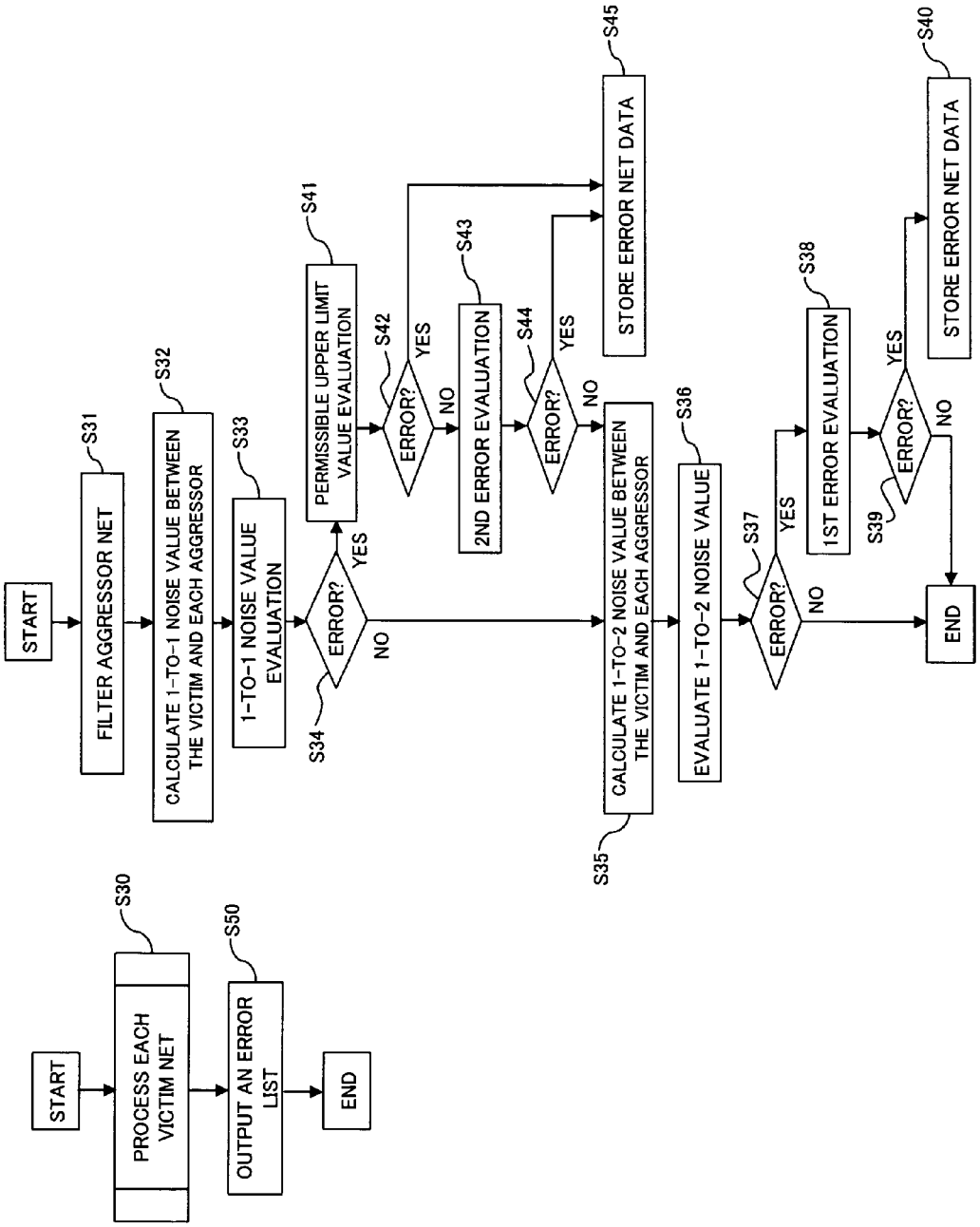
FIG. 7A and FIG. 7B are flow charts indicating an operation (noise checking process) of the noise checking apparatus of the second embodiment.
Figure 8:
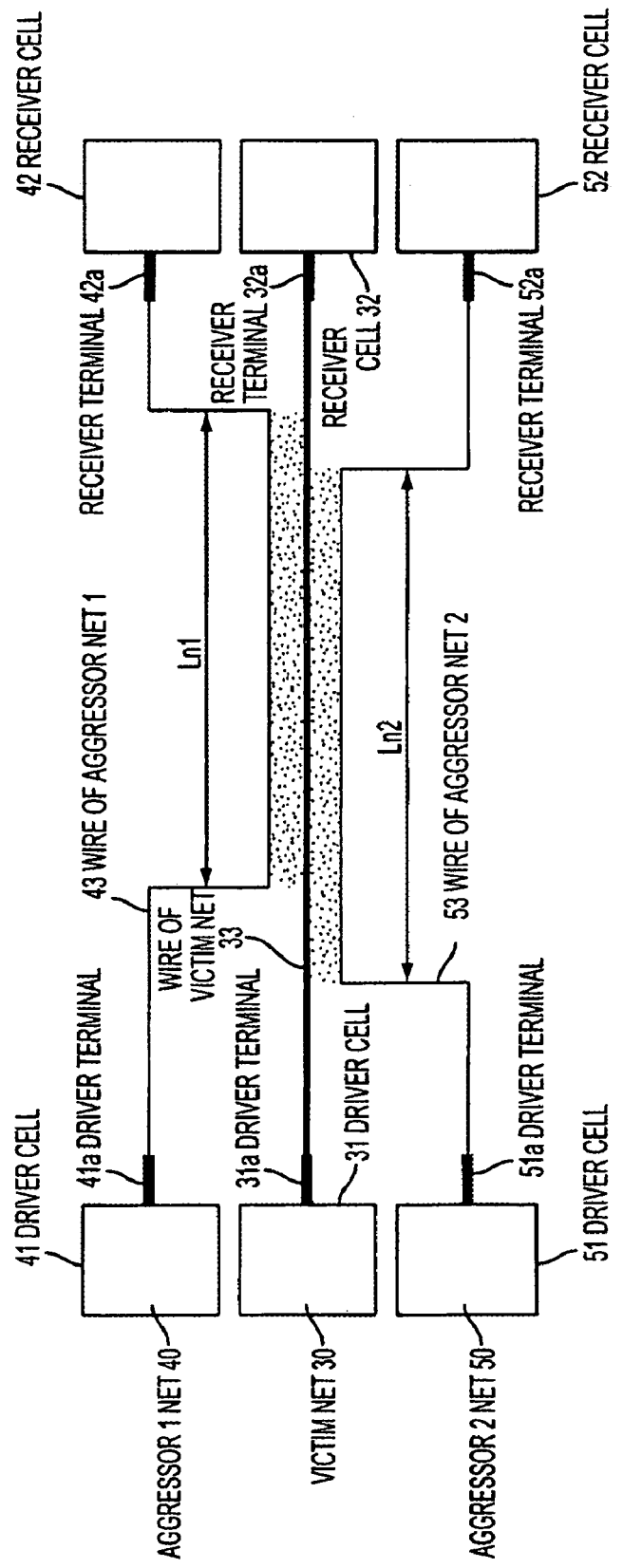
FIG. 8 is a concrete net path model for use in describing calculation/evaluation of a one-to-two noise value of the second embodiment.

Next, a description will be made hereinbelow of an operation of the noise checking apparatus 20 of the second embodiment, referring to FIG. 7A, FIG. 7B, FIG. 8, FIG. 9, and FIG. 11. FIG. 7A and FIG. 7B are flow charts indicating an operation (noise checking process) of the noise checking apparatus 20 of the second embodiment; FIG. 8 is a concrete net path model for use in describing calculation/evaluation of a one-to-two noise value of the second embodiment; FIG. 9 is a timing chart for use in detailing a modified example of error evaluation (evaluation of timing with which the last edge of the signal waveform appears) of the second embodiment; FIG. 11 is an example of an error list obtained by noise check (one-to-two noise check) of the present embodiments.

In the beginning, referring to the flow chart (steps S30, S50, and S31 through S45), an operation (noise checking process) of the noise checking apparatus 20 of the second embodiment is described. The procedures described in FIG. 7A and FIG. 7B will replace procedures of steps S17 through S19 of FIG. 2 (first embodiment).

Similar to the first embodiment of FIG. 2, after cell arrangement and inter-cell wiring are performed, static timing analysis is performed and the analysis result is then evaluated. After that, as shown in FIG. 7A, a noise checking procedure of FIG. 7B is performed for each victim net to be checked (step S30), and an error list obtained as a result of the procedure is output (step S50).

When the noise checking apparatus 20 of the second embodiment is used in designing LSI chips, similar procedures to those of the first embodiment are performed. That is, if any error wire candidates are listed in an error list, a decision is made that noise value errors occur (YES route of step S20 of FIG. 2), and procedures of steps S15, S16, and S20 of FIG. 2 and procedures of FIG. 7A and FIG. 7B are repeated until step S20 makes a NO decision (that is, until no error wire candidates are listed in the error list). After no error wire candidate is present in the error list, manufacture data of the LSI chip is prepared based on the cell arrangement and inter-cell wiring, and the designing of the LSI chip is completed.

Next, a description will be made hereinbelow of the procedure of step S30 of FIG. 7A, that is, the noise checking process of FIG. 7B.

Aggressor nets which can affect one victim net are extracted, by filtering, from the inter-cell wiring result (step S31), and then, as in the case of the first embodiment, the 1-to-1 noise value calculating unit 23 calculates the 1-to-1 noise value $Nv11$ of each aggressor which affects the victim, using the foregoing formula (1) (step S32; 1-to-1 noise value calculating step), and the 1-to-1 noise value evaluating unit 24 evaluates whether or not the 1-to-1 noise value, obtained by the 1-to-1 noise value calculating unit 23, exceeds a first limit value $Lx1$ (step S33; 1-to-1 noise value evaluating step).

If the 1-to-1 noise value $Nv11$ is equal to or smaller than the limit value $Lx1$ ($Nv11 \leq Lx1$), a decision is made that no noise error occurs in the victim (NO route of step S34), and the process of the noise checking apparatus 20 proceeds to step S35 (described later). On the other hand, if the 1-to-1 noise value $Nv11$ exceeds the limit value $Lx1$ ($Nv11 > Lx1$), the victim is recognized as an error wire candidate, in which a noise error occurs (YES route of step S34), and the process of the noise checking apparatus 20 proceeds to step S41 (described later).

If a decision is made that $Nv11 \leq Lx1$ (NO route of step S34), the 1-to-2 noise value calculating unit 25 calculates a 1-to-2 noise value $Nv12$ between the victim, in which $Nv11 \leq Lx1$, and the two aggressors (aggressor 1 and aggressor 2) which can affect the victim, using the foregoing formula (2) (step S35; 1-to-2 noise value calculating step). The 1-to-2 noise value evaluating unit 26 evaluates whether or not the 1-to-2 noise value $Nv12$, obtained by the 1-to-2 noise value calculating unit 25, exceeds the second limit value $Lx2$ (step S36; 1-to-2 noise value evaluating step).

Here, in the second embodiment, as shown in FIG. 8, a wire that has a portion running close to and in parallel with the victim 33 a distance $Ln1$ is regarded as aggressor (aggressor 1) 43. A degree at which the aggressor 43 induces noise onto the signal of the victim 33 is calculated as a 1-to-1 noise value $Nv11a$. At the same time, a wire that has a portion running close to and in parallel with the victim 33 a distance $Ln2$ is regarded as aggressor (aggressor 2) 53. A degree at which the aggressor (aggressor 2) 53 induces noise onto the signal of the victim 33 is calculated as a 1-to-1 noise value $Nv11b$. On the basis of the 1-to-1 noise value $Nv11a$ and the 1-to-1 noise value $Nv11b$, the formula (2) obtains the 1-to-2 noise value $Nv12$, and the thus obtained 1-to-2 noise value $Nv12$ is compared with the second limit value $Lx2$.

In the model shown in FIG. 8, the victim 33 is included in the victim net 30, and connects between the driver terminal 31a of the driver cell 31 and the receiver terminal 32a of the receiver cell 32. The aggressor (aggressor 1) 43 is included in the aggressor net (aggressor 1 net) 40, and connects between the driver terminal 41a of the driver cell 41 and the receiver terminal 42a of the receiver cell 42. The aggressor (aggressor 2) 53 is included in the aggressor net (aggressor 2 net) 50, and connects between the driver terminal 51a of the driver cell 51 and the receiver terminal 52a of the receiver cell 52.

If the 1-to-2 noise value $Nv12$ is equal to or smaller than the second limit value $Lx2$ ($Nv12 \leq Lx2$), it is decided that no noise value error occurs (NO route of step S37), and the noise checking apparatus 20 ends its processing. Whereas, if the 1-to-2 noise value $Nv12$ exceeds the second limit value $Lx2$ ($Nv12 > Lx2$), the victim is recognized as an error wire candidate, in which the occurrence of a noise value error is highly possible.

If the error wire candidate is obtained (YES route of step S37), timing chart information (data for ATW), obtained by the timing analyzing unit 21, is read out from the database 22. On the basis of the timing chart, the first error evaluating unit 27 compares the last edge appearance timing in the signal waveform of a victim (error wire candidate) in which the 1-to-2 noise value evaluating unit 26 decides that $Nv12 > Lx2$, with the last edge appearance timings in the signal waveforms of the two aggressors (aggressor 1 and aggressor 2). According to the comparison result, noise value error evaluation is performed in the victim (step S38; first error evaluating step).

Figure 9:
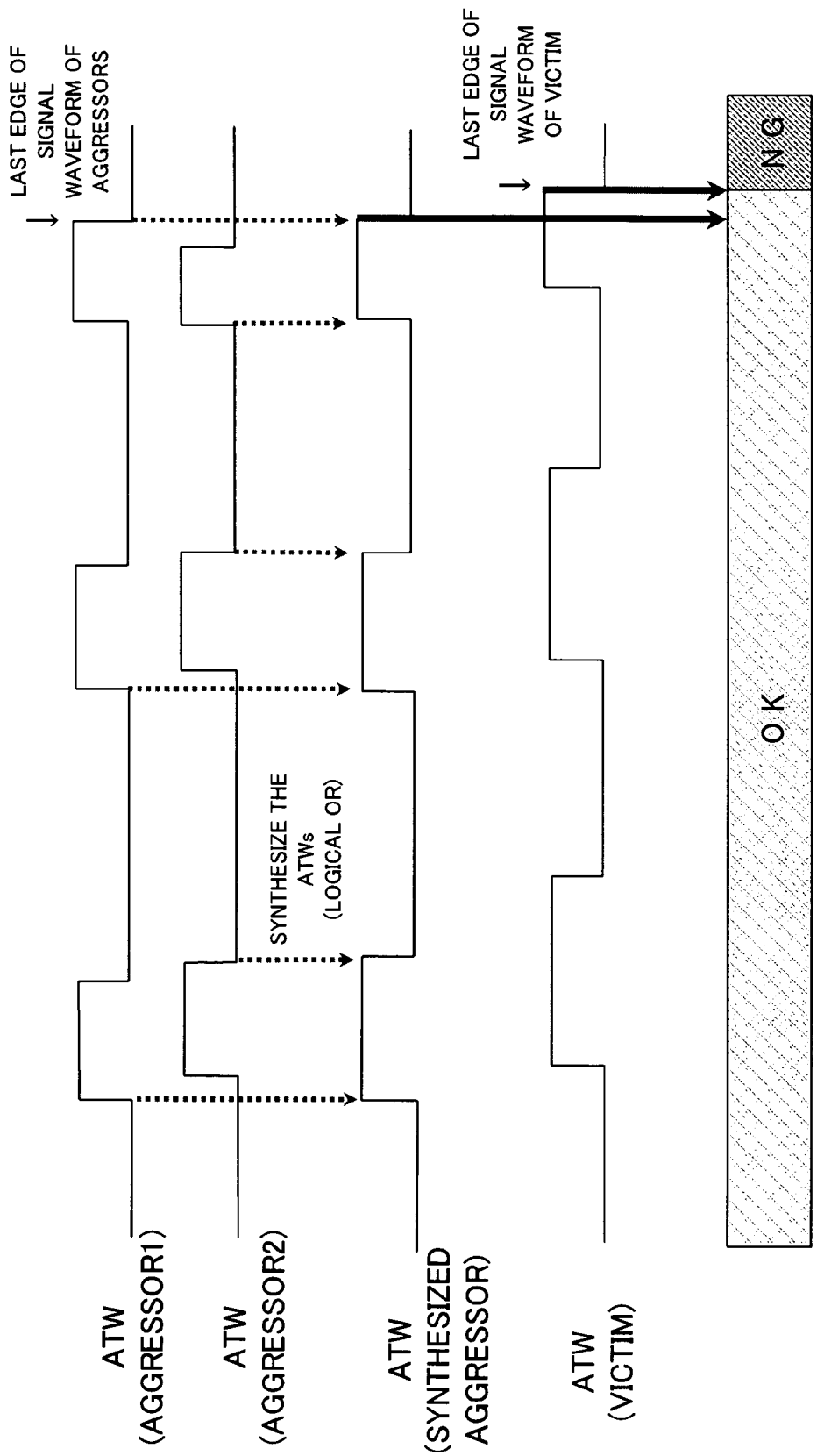
FIG. 9 is a timing chart for use in detailing a modified example of error evaluation (evaluation of timing with which the last edge of the signal waveform appears) of the second embodiment.
Figure 12B:
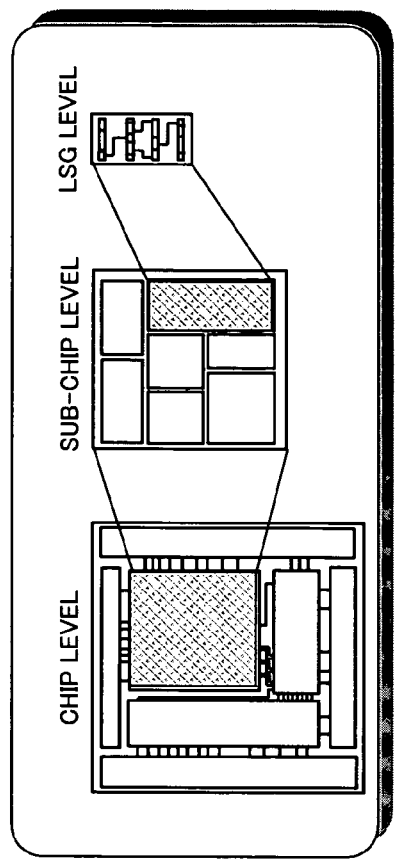
FIG. 12A and FIG. 12B are views for describing the hierarchical morphology of LSI design.
Figure 12A:
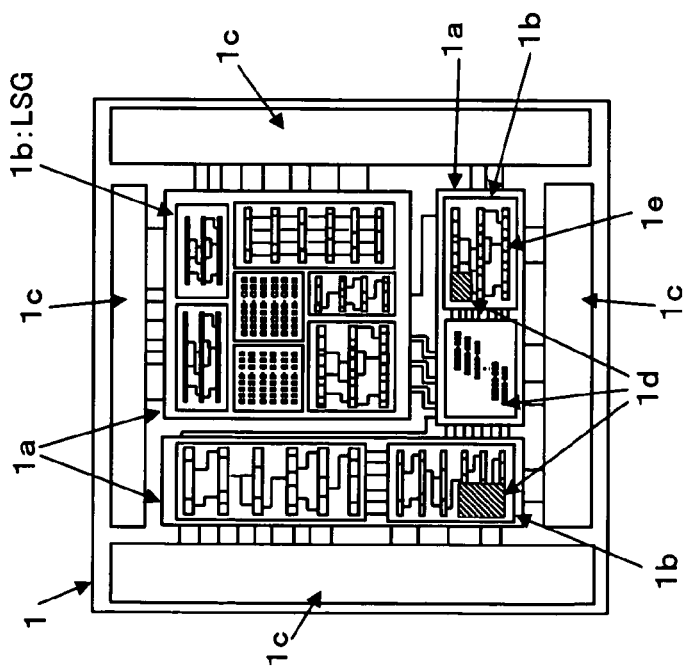

More specifically, the first error evaluating unit 27 obtains the signal waveform of the aggressors (aggressor 1 and aggressor 2) and the victim, as a timing chart (data for ATW) of FIG. 9, for example. As shown in FIG. 9, the signal waveform of the two aggressors (aggressor 1 and aggressor 2) are synthesized to obtain logical OR of the signal waveform, and then, the synthesized waveform and the waveform of the victim are compared to evaluate whether the last edge in the synthesized waveform appears later (NG region of FIG. 9) or earlier (OK region of FIG. 9) than the last edge in the waveform of the victim.

As a result of the comparison, if the last edge appearance timing of the synthesized waveform is later (NG region of FIG. 9) than the last edge appearance timing of the waveform of the victim (error wire candidate), the first error evaluating unit 27 decides that a noise value error occurs in the victim (YES route of step S39), and error net data is output as, for example, an error list of FIG. 11 (1-to-2 noise value check result), and stored in a database or the like (step S40). On the other hand, if the last edge appearance timing of the synthesized waveform is earlier (OK region of FIG. 9) than the last edge appearance timing of the waveform of the victim (error wire candidate), the victim is decided to have no problem in terms of timing (NO route of step S39) even though the 1-to-2 noise value Nv12 exceeds the second limit value Lx2, and the victim is excluded from the error wire candidates, and the processing by the noise checking apparatus 20 is ended.

The error list of FIG. 11 contains not only 1-to-2 check rate (100%), ATW file name (input_atw), a slack file name (input_slack), but also the information about the victim [victim net name (net_dir1/signal1), victim net type (SIGNAL), 1-to-2 limit value (Lx1=2.5)] and information about the aggressor [net names of aggressors 1 and 2 (net_dir1/signal2, net_dir1/signal3), net types of aggressors 1 and 2 (SIGNAL), and 1-to-1 noise value (Nv12=3.5), parallel division length (parallel length) Ln1, Ln2 (500, 1000)].

Here, if the 1-to-1 noise value Nv11 exceeds the limit value Lx1 (Nv11>Lx1; YES route of step S34), the permissible upper limit value evaluating unit 28 evaluates the victim wire in which Nv11>Lx1, in terms of whether or not the 1-to-1 noise value Nv11 exceeds the permissible upper limit value Lx1+B (step S41; permissible upper limit evaluating step).

If Nv11>Lx1+B, it is decided that a noise value error will reliably occur in the victim (error wire candidate) (YES route of step S42), and the error net data is output as an error list (1-to-1 noise value check result) of FIG. 10, for example, and is stored in a database or the like (step S45).

On the other hand, if Nv11≦Lx1+B (NO route of step S42), timing chart information (data for ATW), obtained by the timing analyzing unit 21, is read out from the database 22. On the basis of the timing chart information, the second error evaluating unit 29 compares the last edge appearance timing in the signal waveform of the victim with the last edge appearance timing in the signal waveform of the aggressor, to evaluate the noise value error of the victim according to the comparison result (step S43; second error evaluating step).

After that, as in the case of the error evaluating unit 15 (error evaluating step) of the first embodiment, if the last edge appearance timing in the signal waveform of the aggressor is later than the last edge appearance timing in the signal waveform of the victim (NG region of FIG. 4), the second error evaluating unit 29 decides that a noise value error occurs in the victim (YES route of step S44), and error net data is output as an error list (1-to-1 noise value check result) of FIG. 10, for example, and stored in a database or the like (step S45).

On the other hand, if the last edge appearance timing in the signal waveform of the aggressor is earlier than the last edge appearance timing in the signal waveform of the victim (OK region of FIG. 4), it is decided that the victim has no problem in terms of the timing (NO route of step S44) even though the 1-to-1 noise value Nv11 exceeds the limit value Lx1, and the noise checking apparatus 20 proceeds to step S35.

In this manner, the noise checking apparatus 20 not only realizes like effects and benefits to those of the first embodiment, but also the following advantages. Both the 1-to-1 noise value Nv11 and the 1-to-2 noise value Nv12 of each victim are calculated, and noise check is performed by setting the permissible upper limit value Lx1+B of the 1-to-1 noise value Nv11. This makes it possible to narrow down the error wire candidates, and correction (rearrangement/inter-cell rewiring) is performed on the thus narrowed down wires. As a result, the amount of correction necessitated by noise value errors is further reduced, and this will greatly contribute to reduction of work needed in correction for preventing errors, improvement in freedom of layout design, and reduction of load on DA.

In the second embodiment, also, the first error evaluating unit 27 and the second error evaluating unit 29 compare the last edge appearance timing in the waveform of the victim with the last edge appearance timing in the waveform of the aggressor. At that time, the timing analyzing unit 21 may read out slack values of the driver of each wire from the database 22, and the last edge appearance timing comparison/evaluation may be carried out, taking the slack values into consideration, as already described in the first embodiment with reference to FIG. 5.

[3] Other Modifications

The present invention should by no means be limited to the above embodiments, but various changes or modifications may be suggested without departing from the gist of the invention.

For example, in the second embodiment, a 1-to-1 noise value and a 1-to-2 noise value are combined to evaluate a noise value error. However, the present invention should by no means be limited to this, and a 1-to-1 noise value and a 1-to-m (m is a natural number equal to or greater than 3) noise value can be combined to evaluate the noise value error. In addition, a combination of a 1-to-1 noise value, a 1-to-2 noise value, and at least one kind of 1-to-m (m is a natural number equal to or greater than 3) noise value, can also be employed in noise value error evaluation.

Further, the functions (all or part of the functions) of the timing analyzing units 11 and 21, the noise value calculating units 13, 23 and 25, and the evaluating units 14, 15, 24, and 26 through 29 are realized by a computer (including a CPU, an information processing apparatus, various types of terminals) by executing specific application programs (noise checking programs).

The programs are recorded in computer-readable recording media such as flexible discs, CD-ROMs, CD-Rs, CD-RWs, and DVDs. The computer reads the programs from such recording media to transfer the programs to an internal or external storage device, to store the programs therein. Alternatively, the programs can be recorded in storage devices (recording media) such as magnetic discs, optical discs, and magneto-optical discs, to be transferred to the computer over a communication network.

Here, the "computer" is defined as a concept including hardware and an OS (Operating System), or hardware operating under control of an OS. Further, in cases where hardware is capable of operating by itself without the necessity of an OS, the hardware is equivalent to the "computer." The hardware includes at least a micro processor such as a CPU and a means for reading computer programs from recording media. The aforementioned predetermined application programs contain program codes that instruct the computer to function as the timing analyzing units 11 and 21, the noise value calculating units 13, 23, and 25, and the evaluating units 14, 15, 24, 26 through 29. Further, some of these functions can be realized by the OS, not by such application programs.

Moreover, as recording media used in the embodiments of the present invention, not only the above-mentioned flexible discs, CR-ROMs, CD-Rs, CD-RWs, DVDs, magnetic discs, optical discs, and magneto-optical discs, but also various types of other computer-readable media, such as IC cards, ROM cartridges, magnetic tapes, punch cards, internal storage devices (memories such as RAMs and ROMs), external storage devices, and printed matter with any codes such as barcodes printed thereon, are also applicable.

[Industrial Applicability]

The present invention is capable of extracting victim wires that have a timing problem, from the victims in which it has been evaluated that noise value errors occur. Hence, the amount of correction necessitated by the noise value errors is reduced.

Accordingly, the present invention is suitable for use in designing LSIs on which an extremely great amount of wiring is mounted. The usefulness of the invention is thus very high.

What is claimed is:

1. A noise checking method for performing, after carrying out cell arrangement and inter cell wiring in an integrated circuit, static noise checking on a result of the cell arrangement and the inter-cell wiring, said method comprising:

a timing analyzing step, in which a timing chart of signal transfer on each wire is obtained by performing delay simulation with timing analysis based on the result of the cell arrangement and the inter-cell wiring;

a noise value calculating step, in which a noise value is calculated, said noise value representing a degree at which at least one affecting wire (hereinafter will be called the "aggressor"), running in parallel with an object wire (hereinafter will be called the "victim") to be checked, induces noise onto the victim;

a noise value evaluating step, in which it is evaluated whether or not the noise value calculated at said noise value calculating step exceeds a limit value; and an error evaluating step, in which, if it is evaluated at said noise value evaluating step that the noise value is greater than the limit value, comparison is performed, based on the timing chart obtained at said timing analyzing step, between a last edge appearance timing in a signal waveform transmitted on the victim and a last edge appearance timing in a signal waveform transmitted on the aggressor, and then a decision is made on a noise value error in the victim based on the comparison result.

2. A noise checking method for performing, after carrying out cell arrangement and inter cell wiring in an integrated circuit, a static noise checking on a result of the cell arrangement and the inter-cell wiring, said method comprising:

a timing analyzing step, in which a timing chart of signal transfer on each wire is obtained by performing delay simulation with timing analysis based on the result of the cell arrangement and the inter-cell wiring;

a one-to-one noise value calculating step, in which a one-to-one noise value is calculated, said one-to-one noise value representing a degree at which one affecting wire (hereinafter will be called the "aggressor"), running in parallel with an object wire (hereinafter will be called the "victim") to be checked, induces noise onto the victim;

a one-to-one noise value evaluating step, in which it is evaluated whether or not the one-to-one noise value, calculated at said one-to-one noise value calculating step, exceeds a first limit value;

a one-to-n noise value calculating step, in which, if it is evaluated at said one-to-one noise value evaluating step that the one-to-one noise value does not exceed the first limit value, a one-to-n noise value is calculated, said one-to-n noise value representing a degree at which n (n is a natural number equal to or greater than 2) aggressors, running in parallel with the victim, induces noise onto the victim;

a one-to-n noise value evaluating step, in which it is evaluated whether or not the one-to-n noise value, calculated at said one-to-n noise value calculating step, exceeds a second limit value; and a first error evaluating step, in which, if it is evaluated at said one-to-n noise value evaluating step that the one-to-n noise value exceeds the second limit value, comparison is performed, based on the timing chart obtained at said timing analyzing step, between a last edge appearance timing in a signal waveform transmitted on the victim and last edge appearance timings in signal waveforms transmitted on the n aggressors, and then a decision is made on a noise value error in the victim based on the comparison result.

3. A noise checking method as set forth in claim 2, further comprising:

a permissible upper limit value evaluating step, in which, if it is evaluated at said one-to-one noise value evaluating step that the one-to-one noise value exceeds the first limit value, it is then evaluated whether or not the one-to-one noise value of the victim exceeds a permissible upper limit value which is obtained by adding a specific permissible value to the first limit value; and a second error evaluating step, in which, if it is evaluated at said permissible upper limit evaluating step that the one-to-one noise value does not exceed the permissible upper limit, comparison is performed, based on the timing chart obtained at said timing analyzing step, between a last edge appearance timing in a signal waveform transmitted on the victim and a last edge appearance timing in a signal waveform transmitted on the one aggressor, and then a decision is made on a noise value error in the victim based on the comparison result, if it is evaluated at said second error evaluating step that no noise value error occurs in the victim, the method proceeding to said one-to-n noise value calculating step, said one-to-n noise value evaluating step, and said first error evaluating step.

4. A noise checking method as set forth in claim 2, wherein at said first error evaluating step, when the comparison is performed between the last edge appearance timing in the signal waveform transmitted on the victim and last edge appearance timings in the signal waveforms transmitted on the n aggressors, the signal waveforms of the n aggressors are synthesized, and comparison is made between a last edge appearance timing of the synthesized signal waveform and the last edge appearance timing of the waveform transmitted on the victim.

5. A noise checking method as set forth in claim 1, wherein, at said error evaluating step, if the last edge appearance timing in the signal waveform transmitted on the aggressor is later than the last edge appearance timing in the signal waveform transmitted on the victim, it is evaluated that a noise error occurs in the victim.

6. A noise checking method as set forth in claim 2, wherein, at said first error evaluating step, if the last edge appearance timing in the signal waveform transmitted on at least one of the n aggressors is later than the last edge appearance timing in the signal waveform transmitted on the victim, it is evaluated that a noise error occurs in the victim.

7. A noise checking method as set forth in claim 1,
wherein at said timing analyzing step, a slack value, which is a timing margin of a driver of the victim, is calculated by the delay simulation, and
wherein at said error evaluating step, if the last edge appearance timing in the signal waveform transmitted on the aggressor is later than a timing which is obtained by adding the slack value to the last edge appearance timing of the signal waveform transmitted on the victim, it is evaluated that a noise value error occurs in the victim.

8. A noise checking method as set forth in claim 2,
wherein at said timing analyzing step, a slack value, which is a timing margin of a driver of the victim, is calculated by the delay simulation, and
wherein at said first error evaluating step, if the last edge appearance timing in the signal waveform transmitted on at least one of the n aggressors is later than a timing which is obtained by adding the slack value to the last edge appearance timing of the signal waveform transmitted on the victim, it is evaluated that a noise value error occurs in the victim.

9. A noise checking apparatus for performing, after carrying out cell arrangement and inter cell wiring in an integrated circuit, static noise checking on a result of the cell arrangement and the inter-cell wiring, said apparatus comprising:
a timing analyzing unit, in which a timing chart of signal transfer on each wire is obtained by performing delay simulation with timing analysis based on the result of the cell arrangement and the inter-cell wiring;
a noise value calculating unit, in which a noise value is calculated, said noise value representing a degree at which at least one affecting wire (hereinafter will be called the "aggressor"), running in parallel with an object wire (hereinafter will be called the "victim") to be checked, induces noise onto the victim;
a noise value evaluating unit, in which it is evaluated whether or not the noise value calculated by said noise value calculating unit exceeds a limit value; and
an error evaluating unit, in which, if it is evaluated by said noise value evaluating unit that the noise value is greater than the limit value, comparison is performed, based on the timing chart obtained by said timing analyzing unit, between a last edge appearance timing in a signal waveform transmitted on the victim and a last edge appearance timing in a signal waveform transmitted on the aggressor, and then a decision is made on a noise value error in the victim based on the comparison result.

10. A noise checking apparatus for performing, after carrying out cell arrangement and inter cell wiring in an integrated circuit, static noise checking on a result of the cell arrangement and the inter-cell wiring, said apparatus comprising:
a timing analyzing unit, in which a timing chart of signal transfer on each wire is obtained by performing delay simulation with timing analysis based on the result of the cell arrangement and the inter-cell wiring;
a one-to-one noise value calculating unit, in which a one-to-one noise value is calculated, said one-to-one noise value representing a degree at which one affecting wire (hereinafter will be called the "aggressor"), running in parallel with an object wire (hereinafter will be called the "victim") to be checked, induces noise onto the victim;
a one-to-one noise value evaluating unit, in which it is evaluated whether or not the one-to-one noise value, calculated by said one-to-one noise value calculating unit, exceeds a first limit value;
a one-to-n noise value calculating unit, in which, if it is evaluated by said one-to-one noise value evaluating unit that the one-to-one noise value does not exceed the first limit value, a one-to-n noise value is calculated, said one-to-n noise value representing a degree at which n (n is a natural number equal to or greater than 2) aggressors, running in parallel with the victim, induces noise onto the victim;
a one-to-n noise value evaluating unit, in which it is evaluated whether or not the one-to-n noise value, calculated by said one-to-n noise value calculating unit, exceeds a second limit value; and
a first error evaluating unit, in which, if it is evaluated by said one-to-n noise value evaluating unit that the one-to-n noise value exceeds the second limit value, comparison is performed, based on the timing chart obtained by said timing analyzing unit, between a last edge appearance timing in a signal waveform transmitted on the victim and last edge appearance timings in signal waveforms transmitted on the n aggressors, and then a decision is made on a noise value error in the victim based on the comparison result.

11. A noise checking apparatus as set forth in claim 10, further comprising:
a permissible upper limit value evaluating unit, in which, if it is evaluated by said one-to-one noise value evaluating unit that the one-to-one noise value exceeds the first limit value, it is then evaluated whether or not the one-to-one noise value of the victim exceeds a permissible upper limit value which is obtained by adding a specific permissible value to the first limit value; and
a second error evaluating unit, in which, if it is evaluated at said permissible upper limit evaluating step that the one-to-one noise value does not exceed the permissible upper limit, comparison is performed, based on the timing chart obtained by said timing analyzing unit, between a last edge appearance timing in a signal waveform transmitted on the victim and a last edge appearance timing in a signal waveform transmitted on the one aggressor, and then a decision is made on a noise value error in the victim based on the comparison result,
if it is evaluated by said second error evaluating unit that no noise value error occurs in the victim, the process proceeding to the process performed by said one-to-n noise value calculating unit, said one-to-n noise value evaluating unit, and said first error evaluating unit.

12. A noise checking apparatus as set forth in claim 10, wherein at said first error evaluating unit, when the comparison is performed between the last edge appearance timing in the signal waveform transmitted on the victim and last edge appearance timings in the signal waveforms transmitted on the n aggressors, the signal waveforms of the n aggressors are synthesized, and comparison is made between a last edge appearance timing of the synthesized signal waveform and the last edge appearance timing of the waveform transmitted on the victim.

13. A noise checking apparatus as set forth in claim 9, wherein at said error evaluating unit, if the last edge appearance timing in the signal waveform transmitted on the aggressor is later than the last edge appearance timing in the signal waveform transmitted on the victim, it is evaluated that a noise error occurs in the victim.

14. A noise checking apparatus as set forth in claim 10, wherein at said first error evaluating step, if the last edge appearance timing in the signal waveform transmitted on at least one of the n aggressors is later than the last edge appearance timing in the signal waveform transmitted on the victim, it is evaluated that a noise error occurs in the victim.

15. A noise checking apparatus as set forth in claim 9,
    wherein at said timing analyzing unit, a slack value, which is a timing margin of a driver of the victim, is calculated by the delay simulation, and
    wherein at said error evaluating unit, if the last edge appearance timing in the signal waveform transmitted on the aggressor is later than a timing which is obtained by adding the slack value to the last edge appearance timing of the signal waveform transmitted on the victim, it is evaluated that a noise value error occurs in the victim.

16. A noise checking apparatus as set forth in claim 10,
    wherein at said timing analyzing unit, a slack value, which is a timing margin of a driver of the victim, is calculated by the delay simulation, and
    wherein at said first error evaluating unit, if the last edge appearance timing in the signal waveform transmitted on at least one of the n aggressors is later than a timing which is obtained by adding the slack value to the last edge appearance timing of the signal waveform transmitted on the victim, it is evaluated that a noise value error occurs in the victim.

17. A computer-readable recording medium in which is recorded a noise checking program for a computer to function as a noise checking apparatus for performing, after carrying out cell arrangement and inter cell wiring in an integrated circuit, static noise checking on a result of the cell arrangement and the inter-cell wiring, said program instructing the computer to function as the following:
    a timing analyzing unit, in which a timing chart of signal transfer on each wire is obtained by performing delay simulation with timing analysis based on the result of the cell arrangement and the inter-cell wiring;
    a noise value calculating unit, in which a noise value is calculated, said noise value representing a degree at which at least one affecting wire (hereinafter will be called the "aggressor"), running in parallel with an object wire (hereinafter will be called the "victim") to be checked, induces noise onto the victim;
    a noise value evaluating unit, in which it is evaluated whether or not the noise value calculated by said noise value calculating unit exceeds a limit value; and
    an error evaluating unit, in which, if it is evaluated at said noise value evaluating step that the noise value is greater than the limit value, comparison is performed, based on the timing chart obtained by said timing analyzing unit between a last edge appearance timing in a signal waveform transmitted on the victim and a last edge appearance timing in a signal waveform transmitted on the aggressor, and then a decision is made on a noise value error in the victim based on the comparison result.

18. A computer-readable recording medium in which is recorded a noise checking program for a computer to function as a noise checking apparatus for performing, after carrying out cell arrangement and inter cell wiring in an integrated circuit, static noise checking on a result of the cell arrangement and the inter-cell wiring, said program instructing the computer to function as the following:
    a timing analyzing unit, in which a timing chart of signal transfer on each wire is obtained by performing delay simulation with timing analysis based on the result of the cell arrangement and the inter-cell wiring;
    a one-to-one noise value calculating unit, in which a one-to-one noise value is calculated, said one-to-one noise value representing a degree at which one affecting wire (hereinafter will be called the "aggressor"), running in parallel with an object wire (hereinafter will be called the "victim") to be checked, induces noise onto the victim;
    a one-to-one noise value evaluating unit, in which it is evaluated whether or not the one-to-one noise value, calculated by said one-to-one noise value calculating unit, exceeds a first limit value;
    a one-to-n noise value calculating unit, in which, if it is evaluated by said one-to-one noise value evaluating unit that the one-to-one noise value does not exceed the first limit value, a one-to-n noise value is calculated, said one-to-n noise value representing a degree at which n (n is a natural number equal to or greater than 2) aggressors, running in parallel with the victim, induces noise onto the victim;
    a one-to-n noise value evaluating unit, in which it is evaluated whether or not the one-to-n noise value, calculated by said one-to-n noise value calculating unit, exceeds a second limit value; and
    a first error evaluating unit, in which, if it is evaluated by said one-to-n noise value evaluating unit that the one-to-n noise value exceeds the second limit value, comparison is performed, based on the timing chart obtained by said timing analysis unit, between a last edge appearance timing in a signal waveform transmitted on the victim and last edge appearance timings in signal waveforms transmitted on the n aggressors, and then a decision is made on a noise value error in the victim based on the comparison result.

19. A computer-readable recording medium as set forth in claim 18, said noise checking program further instructing the computer to function as:
    a permissible upper limit value evaluating unit, in which, if it is evaluated by said one-to-one noise value evaluating unit that the one-to-one noise value exceeds the first limit value, it is then evaluated whether or not the one-to-one noise value of the victim exceeds a permissible upper limit value which is obtained by adding a specific permissible value to the first limit value; and
    a second error evaluating unit, in which, if it is evaluated at said permissible upper limit evaluating step that the one-to-one noise value does not exceed the permissible upper limit, comparison is performed, based on the timing chart obtained by said timing analyzing unit, between a last edge appearance timing in a signal waveform transmitted on the victim and a last edge appearance timing in a signal waveform transmitted on the one aggressor, and then a decision is made on a noise value error in the victim based on the comparison result, if it is evaluated by said second error evaluating unit that no noise value error occurs in the victim, the noise checking program instructing the computer to carry out the process performed by said one-to-n noise value calculating unit, said one-to-n noise value evaluating unit, and said first error evaluating unit.

20. A computer-readable recording medium as set forth in claim 18, said noise checking program instructing the computer to function as the first error evaluating unit, wherein when the comparison is performed between the last edge appearance timing in the signal waveform transmitted on the victim and last edge appearance timings in the signal waveforms transmitted on the n aggressors, the signal waveforms of the n aggressors are synthesized, and comparison is made between a last edge appearance timing of the synthesized signal waveform and the last edge appearance timing of the waveform transmitted on the victim.

21. A computer-readable recording medium as set forth in claim 17, wherein when said noise checking program instructs the computer to function as the error evaluating unit, if the last edge appearance timing in the signal waveform transmitted on the aggressor is later than the last edge appearance timing in the signal waveform transmitted on the victim, it is evaluated that a noise error occurs in the victim.

22. A computer-readable recording medium as set forth in claim 18, wherein when said noise checking program instructs the computer to function as the first error evaluating unit, if the last edge appearance timing in the signal waveform transmitted on at least one of the n aggressors is later than the last edge appearance timing in the signal waveform transmitted on the victim, it is evaluated that a noise error occurs in the victim.

23. A computer-readable recording medium as set forth in claim 17, wherein when said noise checking program instructing the computer to function as said timing analyzing unit, a slack value, which is a timing margin of a driver of the victim, is calculated by the delay simulation, and wherein when said noise checking program instructing the computer to function as said error evaluating unit, if the last edge appearance timing in the signal waveform transmitted on the aggressor is later than a timing which is obtained by adding the slack value to the last edge appearance timing of the signal waveform transmitted on the victim, it is evaluated that a noise value error occurs in the victim.

24. A computer-readable recording medium as set forth in claim 18, wherein when said noise checking program instructing the computer to function as said timing analyzing unit, a slack value, which is a timing margin of a driver of the victim, is calculated by the delay simulation, and wherein when said noise checking program instructing the computer to function as said first error evaluating unit, if the last edge appearance timing in the signal waveform transmitted on at least one of the n aggressors is later than a timing which is obtained by adding the slack value to the last edge appearance timing of the signal waveform transmitted on the victim, it is evaluated that a noise value error occurs in the victim.

* * * * *